United States Patent
Bross et al.

[11] Patent Number: 5,225,777
[45] Date of Patent: Jul. 6, 1993

[54] HIGH DENSITY PROBE

[75] Inventors: Arthur Bross; Thomas J. Walsh, both of Poughkeepsie, N.Y.

[73] Assignee: International Business Machines Corporation, Armonk, N.Y.

[21] Appl. No.: 830,875

[22] Filed: Feb. 4, 1992

[51] Int. Cl.⁵ .......................................... G01R 1/067
[52] U.S. Cl. .............................. 324/158 P; 324/158 F
[58] Field of Search .............. 324/158 F, 158 P, 72.5; 439/482, 78, 81, 82

[56] References Cited

U.S. PATENT DOCUMENTS

| | | | |
|---|---|---|---|
| 3,217,283 | 11/1965 | Shlesinger, Jr. | 339/18 |
| 3,383,648 | 5/1968 | Tems | 439/82 |
| 3,792,412 | 2/1974 | Madden | 439/82 |
| 3,806,801 | 4/1974 | Bove | 324/72.5 |
| 4,554,506 | 11/1985 | Faure et al. | 324/158 |
| 4,622,514 | 11/1986 | Lewis | 324/158 P |
| 4,703,984 | 11/1987 | Mitchell, Jr. | 439/70 |
| 4,843,315 | 6/1989 | Bayer et al. | 324/158 P |
| 4,998,885 | 3/1991 | Bearman | 439/66 |

FOREIGN PATENT DOCUMENTS

3115l933A1 7/1983 Fed. Rep. of Germany.

Primary Examiner—Vinh Nguyen
Attorney, Agent, or Firm—Irwin Ostroff

[57] ABSTRACT

There is disclosed a high density test probe assembly, and method of fabricating it. The probe assembly has a multitude of wire-like probe elements whose exposed tips are spaced on centers X and Y to match the centers of closely spaced surface pads of a VLSI circuit. Interconnections to and from the probe elements (for connection to external test equipment) are provided by a multi-layer arrangement of insulating and conducting layers within the body of the probe assembly. The tips of the probe elements are canted relative to vertical so that when the probe assembly is pushed down into mating position onto a VLSI circuit, the probe elements uniformly deflect laterally in one direction only and give a "wiping" action in contacting surface pads of the VLSI circuit together with a desired normal contact force. The method of fabricating the probe assembly includes forcing all of the probe elements through staggered vias in the multilayer arrangement. This step simultaneously makes desired electrical interconnections to the probe elements, precisely aligns and captivates the probe elements, and bends (cants) their ends so that they deflect uniformly in one direction only when the probe assembly is mated with a VLSI circuit.

12 Claims, 2 Drawing Sheets

HIGH DENSITY PROBE

FIELD OF THE INVENTION

This invention relates to an improved electrical test probe assembly, and to a method of fabrication which provides a very high density of probe assembly elements for making a multitude of electrical connections over a small area to very large scale integrated (VLSI) circuits.

BACKGROUND OF THE INVENTION

In the past decade the density per unit area of electronic devices, such as very large scale integrated (VLSI) circuits, has greatly increased. By some estimates this increase in density has been on the order of 10,000 times what it was earlier. The space or area available with a VLSI circuit in which to make the large number of necessary connections to and from it and other circuitry is becoming almost vanishingly small measured by previous standards. As a result, there is now a difficult problem in providing easily mateable connections to and from the VLSI circuits when they are being tested, which connections are also small enough to fit the minute spaces available, and which are reliable and easily manufacturable.

In the present inventor Walsh's U.S. Pat. No. 4,554,506, which has an assignee in common with the present patent application, there is disclosed a modular probe assembly for use in testing VLSI circuits. This probe assembly utilizes a large number of relatively very long thin wire contact "beams" mounted in holes on close centers around the sides of plastic guide elements. These guide elements are stacked together vertically into an assembly. The holes in the guide elements are intentionally not aligned vertically in order to "bow" or pre-buckle each of the contact beams. This pre-buckling helps control the force of each contact beam when its end contacts and wipes against a surface pad on a VLSI circuit. The contact beams are permitted to flex dynamically near their lengthwise mid-points when the beams are pressed into contact with the surface pads of the VLSI circuit. In actual practice, because of the relatively large degree of dynamic flexing of the contact beams and in order to insure that they do not touch each other and cause electrical short-circuits, the beams were made of thin, pre-insulated wires. By way of example, the wires were about 4 mils in diameter with about one mil of insulation (such as polyimide). It has been found however that occasionally some of the insulation on the wires in the vicinity of their ends rubs off and comes between the ends and the contact pads on a VSLI circuit under test. This causes erratic electrical results and necessitated careful and regular cleaning of the contact beams.

As VLSI circuits have become even more dense, it has become desirable to provide contact "beams" or elements of a probe assembly throughout an area rather than merely around the periphery of the test probe assembly. But this in turn leads to the problem of making individual electrical connections from other circuitry (e.g., test equipment) to each of the densely packed contact elements of the probe assembly. By way of example, there may be a density of 10,000 or more surface pads per square inch of area of a VLSI circuit with the corresponding need to space the contact elements of a probe assembly on 10 mil or closer centers in both the "X" and "Y" directions. It is desirable to provide an effective and economical solution to this need.

SUMMARY OF THE INVENTION

Viewed from one aspect, the present invention is directed to a test probe assembly in which a body of the test probe assembly includes multi-layer printed circuitry (e.g., multiple alternating conductive and insulating layers with the each conductive layers being a plurality of individual conductors). The various layers of printed circuitry are selectively connected at specially provided "via" locations to respective ones of very thin, relatively long conductive wires. These wires serve not only as connections from layer to layer for the multi-layer circuitry, but also as closely spaced probe elements positioned in rows X and Y for contacting the closely spaced surface pads of a VLSI circuit. The vias of the multi-layer circuitry are formed in a precise pattern which permits a wire contact (probe element) to pierce through portions of the conductive layer much like a pin pierces a thin piece of metal. Thus each probe element makes good mechanical and electrical contact to one or more selected conductors of the conductive layers. The probe elements are deliberately bowed in one direction to captivate them and to provide a small degree of offset (cant) of their ends (tips). When these probe tips come in contact with surface pads of a VLSI circuit, the probe elements deflect uniformly vertically and in one lateral direction which "wipes" clean the surface pads of the VLSI circuit and results in a uniform normal contact force.

Viewed from another aspect, the present invention is directed to a method of fabricating a probe assembly. A multi-layer arrangement of insulating and conductive layers within the probe assembly is provided with "via" locations in accordance with a selected pattern of interconnections to and from the probe elements of the assembly and external test equipment. The via locations lie in an X and Y pattern corresponding to the locations of surface pads on a VLSI circuit to be tested. Then a multitude of wire-like probe elements are forced through the multi-layer arrangement at the via locations to make selected electrical contact with portions of at least one of the conductive layers. The vias are aligned vertically in one plane of view (e.g., the Y direction) and are staggered vertically in a plane of view at right angles. Thus when the probe elements are forced through the vias, the probe elements are substantially bowed vertically. This results in the exposed ends of the probe elements being slightly offset (canted) from the vertical and pre-disposed to uniform, lateral deflection in only one direction. The probe elements are captivated in this way and precisely located and aligned on very close centers. The parts thus assembled are self-aligning with great accuracy. The desired high-density interconnections to and from the probe elements are automatically made by the multilayer conductors in the course of the fabrication of the probe assembly.

Viewed from another aspect, the present invention is directed to a probe assembly. The probe assembly comprises a body with a plurality of insulating and conductive layers in a multi-layer arrangement. The multi-layer arrangement defines a plurality of vias therein with the vias being precisely positioned in horizontal rows X and Y on close centers and staggered vertically. There are a plurality of wire-like probe elements captivated in the vias of the multi-layer arrangement and extending for a short length outwardly therefrom to respective tips which are designed to contact respective surface pads of an electronic circuit. The tips of the probe elements are uniformly offset slightly such that the tips are precisely aligned X and Y and deflect laterally in one direction only when some are moved down into mating contact with the surface pads of the circuit.

Viewed from still another aspect, the present invention is directed to a method of fabricating a probe assembly comprising the steps of providing a multi-layer arrangement of insulating and conductive layers within the probe assembly body, providing "via" locations in the body of the probe assemble in accordance with a precisely staggered pattern of interconnections to and from probe elements of the assembly and external test equipment, and forcing a multitude of wire-like probe elements through the vias to make selected electrical contact with portions of the conductive layers. The vias are aligned vertically in a plane of view and are staggered vertically in a plane of view at right-angles such that after the probe elements are forced through the vias, the probe elements are substantially bowed in one direction only.

A better understanding of the invention, together with its important advantages will best be gained from a study of the following description given in conjunction with the accompanying drawing and claims.

DETAILED DESCRIPTION

Figure 1A:
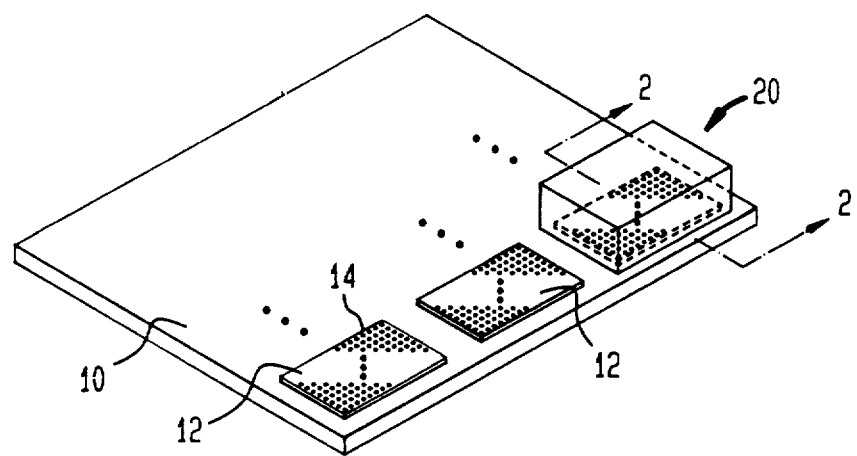
FIG. 1A is an enlarged schematic view in perspective of several VLSI circuits as arranged on a test fixture with a probe assembly in accordance with the present invention one of the VLSI circuits.
Figure 2:
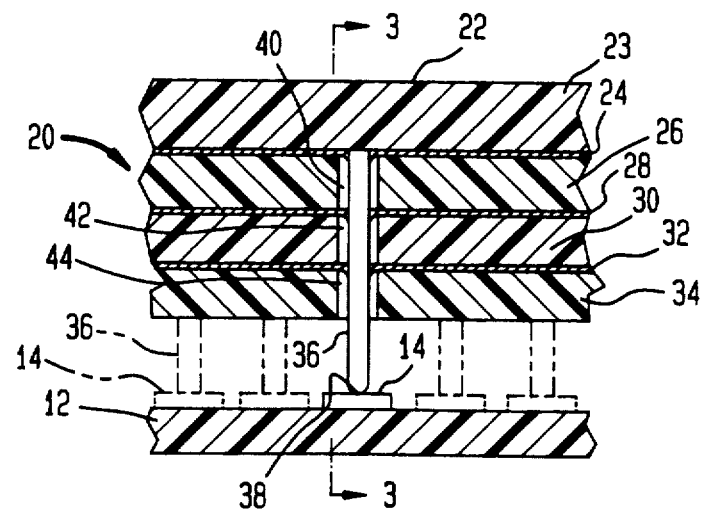
FIG. 2 is a greatly enlarged cross-sectional view taken along the dashed lines 2—2 of FIG. 1A showing a portion of the probe assembly and schematically illustrating how contact probe elements of the assembly make a multitude of interconnections to and from test equipment (not shown) and the VLSI circuit during testing.

Referring now to FIG. 1A, there is shown in schematic form a portion of a test fixture 10 (a suitable support) on which are mounted a plurality of very large scale integrated (VLSI) circuits 12. A probe assembly 20, which is in accordance with the present invention, is shown contacting one of the VLSI circuits 12. A detailed cross-sectional view of the probe assembly 20 is shown in FIG. 2. Three VLSI circuits 12 are shown, but it is to be understood that more or fewer than these may be mounted on the fixture 10. Each VLSI circuit 12 has a large number of very small surface contact pads 14 closely spaced in orthogonal directions and lying substantially in a flat plane on the upper face of the VLSI circuit. These surface pads 14 provide miniature electric contacts to internal active elements (not shown) of the VLSI circuit 12.

Figure 1B:
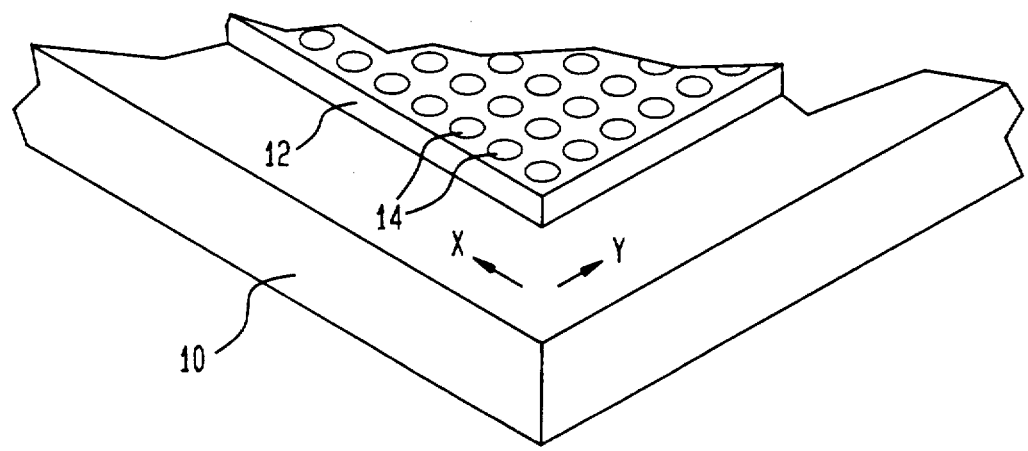
FIG. 1B is a further enlarged view partially broken away of a portion of a VLSI circuit of FIG. 1A showing closely spaced surface contact pads of the VLSI circuit.

Referring now to FIG. 1B, there is shown a greatly enlarged portion of a VLSI circuit 12 (partially broken away) where the individual surface contact pads 14 (shown greatly enlarged) are more easily seen. By way of example, each surface pad 14 may be 5 mils in diameter, with the individual pads 14 spaced evenly on 10 mil centers X and Y. Thus, for a surface area of 70 × 100 mils of a VLSI circuit 12, there are 70 contact pads 14. This very high density has previously made it difficult to provide electrical connections from test equipment (not shown) to and from the VLSI circuit 12. The probe assembly 20 (see FIG. 1A) provides an effective and economical solution to this problem and is positioned over and in mating contact with the respective surface pads 14 of one of the VLSI circuits 12 on the test fixture 10.

Referring now to FIG. 2, there is shown in enlarged cross-sectional view, not to scale, and in partially schematic form, of a portion of the probe assembly 20. For the purpose of simplifying this drawing there is shown here in conjunction with the portion of the probe assembly 20 that is shown, only a single surface pad 14 of the VLSI circuit 12 (FIG. 1B). The test fixture 10 is not shown here. It is to be understood however that a number of such surface pads 14 (indicated by the dotted lines) are present on X and Y centers (FIG. 1B) and are simultaneously contacted by elements of the probe assembly 20 during testing of the VLSI circuit 12. The probe assembly 20 comprises a body 22 which includes numerous internal electrical conductors (to be described hereinafter) in a high density multi-layer arrangement. By way of example, this multi-layer arrangement comprises a top insulating layer 23, a first conductive layer 24, a second insulating layer 26, a second conductive layer 28, a third insulating layer 30, a third conductive layer 32, and a fourth or bottom insulating layer 34. Each of the conductive layers typically comprises a plurality of individual conductors. These individual conductors are some times denoted as a "printed circuit". These layers of insulation and conductors are suitable bonded together into a unitary structure to provide a multilayer arrangement, such as is well known in the art. Electrical connections vertically between the various layers of conductive circuitry 24, 28 and 32 of the multi-layer arrangement are selectively provided by a plurality of wire-like probe elements 36, only one of which is shown here for the sake of simplicity. It is to be understood however that identical probe elements 36 (indicated by the dashed lines) are arranged within the probe assembly 20 in an X and Y pattern corresponding to the pattern of the surface pads 14 (see FIG. 1B). Each probe element 36 has a lower end (tip) 38 which may be rounded and which bears against and makes electrical contact to a respective one of the surface pads 14 of the VLSI circuit 12. The tips 38 and the pads 14 may have suitable metal layers deposited thereon. The probe element 36 passes through a small, precisely located clearance hole 40 in the second insulating layer 26, through a similar hole 42 in the third insulating layer 30, and through a similar hole 44 in the fourth insulating layer 34. As seen here these holes 40, 42, and 44 are aligned vertically, and each probe element 36 as viewed here is vertical. The holes 40, 42 and 44 are shown somewhat exaggerated in diameter for the sake of illustration.

Figure 3:
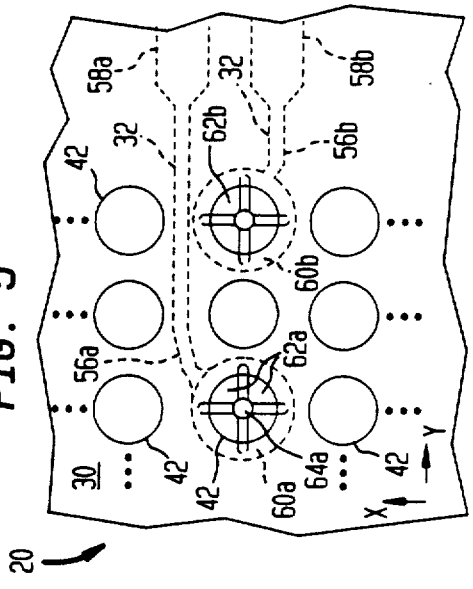
FIG. 3 is a similar cross-sectional view taken as indicated by the dashed line 3—3 in FIG. 2 and illustrating precisely controlled curvature and positioning of each row of the probe elements of the probe assembly.

Referring now to FIG. 3, there is shown a schematic cross-sectional view of the probe assembly 20 similar to that shown in FIG. 2, but seen here at right-angles to that view. As seen here in FIG. 3, the holes 40, 42, and 44 (exaggerated in diameter) are staggered vertically and the probe elements 36 (only one being shown) substantially bowed or curved vertically in passing down through the various insulating layers 26, 30, and 34, and the layers of conductive circuitry 24, 28, and 32. Each probe element 36 is exactly positioned and captivated in this manner and its lower end or tip 38 canted slightly to the left of vertical. All of the tips 38 are thus uniformly aligned with great precision and thus properly mate with respective ones of the closely spaced surface pads 14 of the VLSI circuit 12. And, by virtue of this slight canting or uniform offsetting of the tips 38 of the probe elements 36, the unsupported lower portions of the probe elements 36 all uniformly deflect sideways (to the left) when the tips 38 respectively come into contact with the surface pads 14 and then the probe assembly 20 moves farther downward.

Figure 4A:
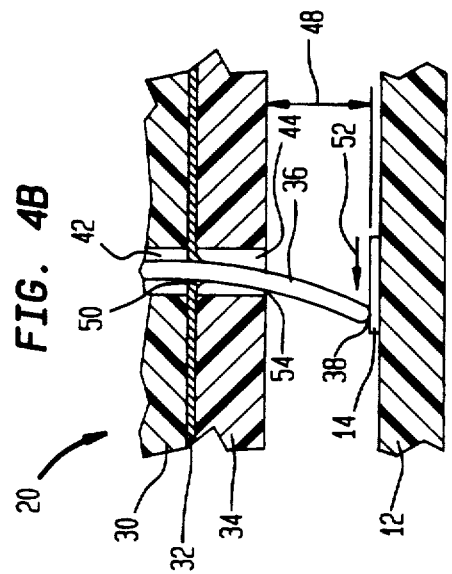
FIG. 4A is a further enlarged cross-sectional view similar to FIG. 3 showing schematically how a probe element of the assembly initially contacts a surface pad of the VLSI circuit.

Referring now to FIG. 4A, there is shown a further enlarged portion of the probe 20. Only a single probe element 36 is shown here. The probe element 36 has a lower, unsupported portion 48 extending from the bottom of the insulating layer 34 (and the hole 44) down to its tip 38 and the surface pad 14. As illustrated here, the tip 38 of the probe element 36 is in contact with the pad 14. The upper length of the probe element 36 (only a portion of which is shown here) extends downward within the multi-layer circuitry of the probe assembly 20 through the small hole 42 in the insulating layer 30. The probe element 36 pierces downward at a zone 50 through the thin layer of conductive circuitry 32 and continues downward through the hole 44 in the insulating layer 34 to the surface pad 14. As will be explained in greater detail shortly, the probe element 36 in piercing through the layer of conductive circuitry 32 at the zone 50 makes a mechanically tight and good electrical connection to a respective conductive portion of the layer of circuitry 32. In this way the probe element 36 is electrically interconnected (in any desired sequence) selectively to the layers of conductive circuitry 24, 28 and 32 (see also FIG. 3). The probe element 36 is also mechanically anchored or captivated in the body 22 of the probe assembly 20.

Figure 4B:
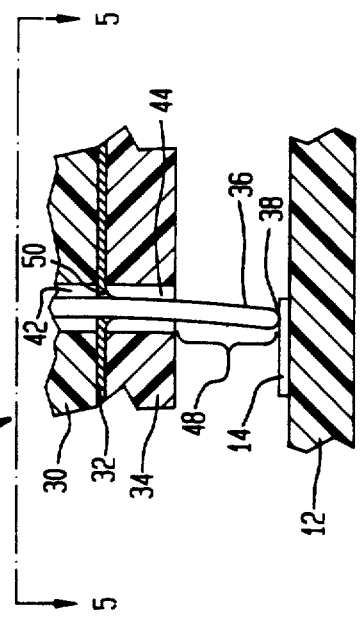
FIG. 4B is similar to FIG. 4A, but illustrates how the probe element flexes and laterally "wipes" the surface pad when the probe assembly moves farther down to the position shown.

Referring now to FIG. 4B, the probe assembly 20 is shown moved downward farther to its fully mated position on the test fixture 10 (not shown here). During this final downward movement from the position of FIG. 4A to that of FIG. 4B, the tip 38 of the probe element 36 is "wiped" a small amount laterally on the surface pad 14, as indicated by a small arrow 52 (pointing to the left). This wiping action insures clean contact and good electrical connection between the pad 14 and the probe tip 38. The probe element 36, where it emerges from the bottom of the insulating layer 34, bears at 54 against the lower lip of the hole 44. Thus the unsupported length 48 (see also FIG. 4A) of the probe element 36 is dimensionally defined by an exact amount. In other words, this unsupported length 48 will be the same for each and all of the probe elements 36, regardless of whether a particular probe element 36 pierces a conductive portion of the layer of conductive circuitry 32 at the zone 50. Thus all of the tips 38 of the probe elements 36 (only one of which is shown) bear with substantially equal and uniform contact forces and in exact positions against their respective pads 14. The unsupported length 48 of the probe element 36, its diameter and the amount of vertical and sideways deflection of the probe element 36, are chosen to give a "wipe" indicated by the arrow 52 of a mil or so and a normal contact force of the order of 50 grams.

Figure 5:
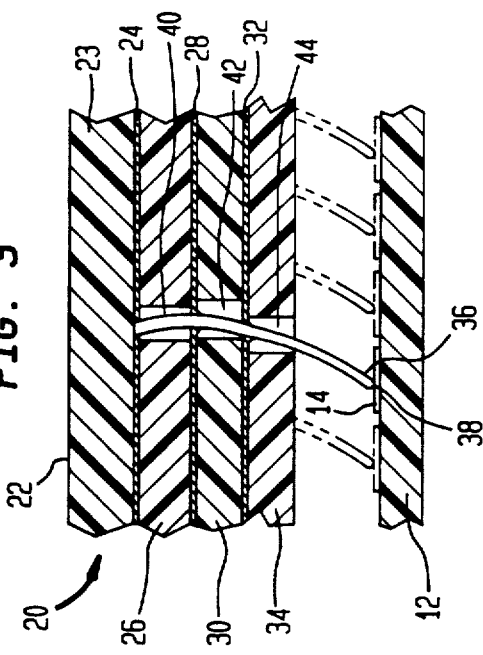
FIG. 5 is a further enlarged plan view (partially broken away) of insulation and of electrical printed circuit traces on one level of the probe assembly as indicated by the dashed lines 5—5 in FIG. 4A.

Referring now to FIG. 5, there is shown a further enlarged plan view (not to scale) of a portion of the probe assembly 20 taken as indicated by the dashed lines 5—5 in FIG. 4A. As seen in FIG. 5, the insulation layer 30 has a number of the small holes 42 positioned on exact centers in the X and Y directions to match the respective centers of the surface pads 14 (FIG. 1B). These holes 42 (and similarly the holes 40 and 44) are positioned and formed with "photographic" accuracy in their respective insulating layers 26, 30 and 34 (not shown in FIG. 5 but shown in FIG. 3) by suitable means well known in the art (such as a laser). The layer of conductive circuitry 32 positioned beneath the insulating layer 30 (see FIG. 4A) is shown here in dotted outline and is seen to comprise a plurality of electrically isolated printed-circuit traces (conductors) 56a and 56b. As many or as few of these circuit traces 56a and 56b may be provided in the layer of conductive circuitry 32 as required by the desired member of interconnections to and from the respective probe elements 36 (none of which is shown here but which are shown in FIG. 3). The traces 56a and 56b connect respectively to externally accessible tabs or contacts 58a and 58b which are positioned on suitable centers and which are adapted to be connected to test equipment (not shown). The positions, spacings, and shapes of the conductive traces 56a, 56b, etc., are provided in accordance with design rules well known to those skilled in the art of designing and fabricating multi-layer circuitry.

Partially exposed beneath a hole 42 is a conductive land portion 60a of the conductive trace 56a. This conductive land 60a is etched into the segmented shape shown so that, for example, four pie-shaped "fingers" 62a project toward a small center hole 64a. A similar conductive land 60b is shown, by way of example, beneath another hole 42 in the insulating layer 30. When a probe element 36 (which is suitably larger in diameter than the center hole 64a) is forced downward through the hole 42, the conductive land 60a is "pierced" and its fingers 62a are bent downward by the probe element 36. This is akin to a pin being driven through a thin piece of metal. It is relatively easy to then push the pin farther through the metal, but very difficult to pull it back. The spring action of the land 60a and its fingers 62a, in conjunction with the substantial vertical bending of the probe element 36, establishes good electrical and mechanical contact between the probe element 36 and the pierced land 60a at the zone 50 (FIG. 4A). It is to be appreciated that the holes 42 in the insulating layer 30 are staggered by a precisely determined distance in the Y direction relative to the corresponding holes 40 in the insulating layer 26, and the holes 44 in the insulating layer 34 (see FIG. 3). This precise staggering of the holes 40, 42, and 44, together with the corresponding positioning of conductive lands (such as the lands 60a and 60b of FIG. 5) at desired locations in the layers of conductive circuitry 24, 28 and 32 (see FIG. 3), results in the uniform bowing and offsetting and the exact positioning of each of the probe elements 36 and their tips 38.

In accordance with a method provided by the present invention, the probe assembly 20 is precisely and economically fabricated. The probe assembly 20 is provided with "via" locations in accordance with a selected pattern of interconnections to and from the probe elements of the assembly and external test equipment (see FIGS. 3, 4A and 5). The via locations lie in an X and Y pattern corresponding to the locations of surface pads on a VLSI circuit to be tested (FIGS. 1B and 5). Then a multitude of wire-like probe elements are forced through the vias making selected electrical contact with respective portions of the multi-layer circuitry (see FIGS. 2 and 3). The vias are aligned vertically in one plane of view (e.g., the direction in FIG. 2) and are staggered vertically in a plane of view at right angles (FIG. 3). Thus when the probe elements are forced down through the vias, (the insulating layer 23 of FIGS. 2 and 3 being removed) the probe elements are substantially bowed vertically. This results in the exposed ends of the probe elements being slightly canted from the vertical and pre-disposed to uniform, lateral deflection in only one direction (FIGS. 4A and 4B). The probe elements are captivated in this way and precisely located and aligned on very close centers. The parts thus assembled are self-aligning with great accuracy. The desired high-density interconnections to and from the probe elements are automatically made in the course of the fabrication of the probe assembly. The probe elements 36 being bare of insulation do not cause a problem of insulation rubbing off of the probe elements 36 and getting between the tips 38 and the surface pads 14. The probe elements, by way of example, may be beryllium copper wire of suitable temper and 4 mils in diameter.

It is to be understood that the assembly and method described herein are illustrative of the general principles of the invention. Modifications may readily be devised by those skilled in the art without departing from the spirit and scope of the invention. For example, the invention is not limited to a particular number of contacts or size of probe assembly, or to the specific materials described. Vias and probe elements of different sizes may be used and dimensions other than those disclosed can be used. Still further, a multi-layer arrangement with a different number of layers or of different designs from that disclosed may be employed, and the probe elements need not have rounded ends.

What is claimed is:

1. A probe assembly comprising:
    a body containing a plurality of insulating and conductive layers positioned horizontally in a vertically stacked multi-layer arrangement;
    the layers of the multi-layer arrangement defining a plurality of vias therein, the vias in each layer being precisely positioned in horizontal rows on close centers and being staggered vertically with resect to vias in other layers; and
    a plurality of flexible wire-like probe elements captivated in the vias of the muli-layer arrangement with each extending for a short length outwardly therefrom to a respective tip which is capable of contacting a surface pad of an electronic circuit, the tips of the probe elements being uniformly offset slightly in a horizontal direction relative to the vertical, the tips being precisely aligned in horizontal rows, and being adapted to deflect uniformly in one horizontal direction only when they are moved vertically down into mating contact with the surface pads of the circuit.

2. The probe assembly of claim 1 wherein:
    the vias are vertically staggered by an amount sufficient to bow the probe elements captivated in the respective bias; and
    the probe elements are held substantially bowed in the multi-layer arrangement such that secure mechanical and electrical connections between the probe elements and the multi-layer arrangement are made.

3. The probe assembly of claim 2 wherein the lengths of the probe elements extending outwardly from the multi-layer arrangement are substantially identical.

4. A high-density test probe assembly comprising:
    a body containing a plurality of insulating and conductive layers arranged horizontally and stacked vertically in a multi-layer arrangement;
    a plurality of conductive lands in the conductive layers;
    the insulating layers defining a plurality of holes therethrough, the lands and the holes of respective layers being positioned horizontally on close centers in rows and being staggered vertically a predetermined amount with resect to corresponding lands and holes in adjacent layers; and
    a plurality of thin flexible wires passing generally vertically through the staggered lands and holes and each extending for a short unsupported length beneath the body to end tip which is canted with respect to vertical and which is capable of contacting a surface pad of an electronic circuit;
    the wires making tight mechanical and electrical connections to respective ones of the lands and being held bowed substantially uniformly, and the wires forming probe elements having tips which are uniformly aligned and which deflect in one horizontal direction only when the probe assembly is moved vertically down into mating contact with the surface pads of the electronic circuit such that contact wiping and a desired normal contact force are obtained.

5. The probe assembly of claim 4 wherein the lands are pre-etched to permit the respective wires more easily to pierce through them and to make tight mechanical and electrical contact between the wires and the lands, the wires being substantially bowed and mechanically captivated in the body of the assembly and being selectively interconnected by the conductive lands to other circuitry.

6. The probe assembly of claim 5 wherein the wires are on precise centers of approximately 10 mils spacing, and the wire tips are precisely aligned with respect to the surface pads of the electronic circuit.

7. The probe assembly of claim 5 wherein the unsupported lengths of the wires beneath the body of the probe assembly are substantially identical and flexing of the wires is substantially uniform.

8. The probe assembly of claim 7 wherein the wires are about 4 mils in diameter and are bare of insulation.

9. The probe assembly of claim 8 in which the tips of the wires are rounded and are each covered with a contact metal.

10. A test probe assembly comprising:
    a body containing a plurality of horizontally positioned insulating and conductive layers vertically stacked in a multi-layer circuit arrangement;

a plurality of conductive lands in the conductive layers, the insulating layers defining a plurality of holes therethrough, the lands being formed into spring fingers, and the holes and lands being positioned horizontally on close centers in rows and being staggered vertically from layer to layer a pre-determined amount;

a plurality of thin flexible wires passing vertically through the lands and holes and each extending for a short unsupported length beneath the body to an end tip with which to contact a surface pad of an electronic circuit;

the wires making tight mechanical and electrical connections to respective ones of the spring fingers of the lands and being bowed substantially in one horizontal direction within the body of the probe assembly; and the wires forming probe elements having tips which are uniformly aligned and are canted slightly relative to vertical and which deflect in one horizontal direction only when the probe assembly is moved vertically down into mating contact with the surface pads of the electronic circuit such that contact wiping and a desired normal contact force are obtained.

11. A probe assembly comprising:

a three-dimensional body containing a plurality of horizontal insulating and conductive layers vertically stacked together in an electrically interconnecting multilayer arrangement;

each of the respective horizontal layers of the multilayer arrangement defining a plurality of vias therein, the vias in the respective horizontal layers being precisely positioned on close centers in first and second horizontal directions orthogonal to each other, and the vias in one layer being staggered vertically relative to corresponding vias in another layer by an amount measured in the first direction; and a plurality of flexible wire-like probe elements captivated by and extending through the vias of the multilayer arrangement and respectively making tight electrical contact with selected portions of the conductive layers, each of the probe elements extending a short unsupported length vertically downward beyond the multi-layer arrangement and ending in contact tip, the tips being uniformly offset in the first direction relative to vertical and being precisely aligned in both the first and second directions, and the tips being adapted to deflect substantially uniformly in the vertical and the first directions only when they are moved vertically down into mating contact with respective surface pads of an electronic circuit.

12. The probe assembly of claim 11 wherein the probe elements are thin tempered wires which are tightly held uniformly bowed in the first direction in extending through the respective vias of the multi-layer arrangement and are mechanically and electrically secured by the multi-layer arrangement.

* * * * *

UNITED STATES PATENT AND TRADEMARK OFFICE
CERTIFICATE OF CORRECTION

PATENT NO. : 5,225,777
DATED : July 6, 1993
INVENTOR(S) : Arthur Bross, et. al.

It is certified that error appears in the above-indentified patent and that said Letters Patent is hereby corrected as shown below:

Column 8, line 58, claim 1, delete "resect" and insert -- respect--.
Column 8, line 7, claim 2, delete "bias" and insert --vias--.
Column 8, line 26, claim 4, delete "resect" and insert --respect--.

Signed and Sealed this

Ninth Day of August, 1994

Attest:

BRUCE LEHMAN

Attesting Officer

Commissioner of Patents and Trademarks